US012284844B2

(12) United States Patent
Wi et al.

(10) Patent No.: US 12,284,844 B2
(45) Date of Patent: Apr. 22, 2025

(54) DISPLAY DEVICE USING SEMICONDUCTOR LIGHT-EMITTING ELEMENTS AND METHOD FOR MANUFACTURING SAME

(71) Applicant: LG ELECTRONICS INC., Seoul (KR)

(72) Inventors: Kyoungtae Wi, Seoul (KR); Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 424 days.

(21) Appl. No.: 17/782,481

(22) PCT Filed: Dec. 5, 2019

(86) PCT No.: PCT/KR2019/017061
§ 371 (c)(1),
(2) Date: Jun. 3, 2022

(87) PCT Pub. No.: WO2021/112284
PCT Pub. Date: Jun. 10, 2021

(65) Prior Publication Data
US 2023/0006102 A1 Jan. 5, 2023

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/018* (2025.01); *H10H 20/857* (2025.01); *H10H 20/032* (2025.01)

(58) Field of Classification Search
CPC ............... H01L 33/382; H01L 25/0753; H01L 33/0093; H01L 33/62; H01L 2933/0016; H01L 2933/0066
See application file for complete search history.

(56) References Cited

U.S. PATENT DOCUMENTS

2016/0043061 A1* 2/2016 Rhee ................. H01L 33/44
257/89

FOREIGN PATENT DOCUMENTS

JP 2006-140398 A 6/2006
KR 10-2018-0055549 A 5/2018
(Continued)

*Primary Examiner* — Kyoung Lee
*Assistant Examiner* — Sophia W Kao
(74) *Attorney, Agent, or Firm* — Birch, Stewart, Kolasch & Birch, LLP

(57) ABSTRACT

The present invention provides a display device including a substrate, a wiring electrode disposed on the substrate, and a plurality of semiconductor light emitting devices electrically connected to the wiring electrode, an anisotropic conductive layer disposed between the semiconductor light emitting devices and made of a mixture of conductive particles and an insulating material, and a light transmitting layer formed between the semiconductor light emitting devices. And the anisotropic conductive layer is formed in plurality, and any one of the plurality of anisotropic conductive layers is formed to surround one semiconductor light emitting device or to surround a plurality of semiconductor light emitting devices adjacent to each other.

5 Claims, 11 Drawing Sheets

(51) Int. Cl.
    *H10H 20/01*        (2025.01)
    *H10H 20/857*     (2025.01)

(56) References Cited

FOREIGN PATENT DOCUMENTS

| | | | |
|---|---|---|---|
| KR | 10-2019-0052112 A | 5/2019 | |
| KR | 10-2019-0057681 A | 5/2019 | |
| KR | 10-2019-0098329 A | 8/2019 | |
| WO | WO 2014/140796 A1 | 9/2014 | |
| WO | WO-2018092977 A1 * | 5/2018 | ............... G09F 9/30 |

* cited by examiner

[FIG. 1]
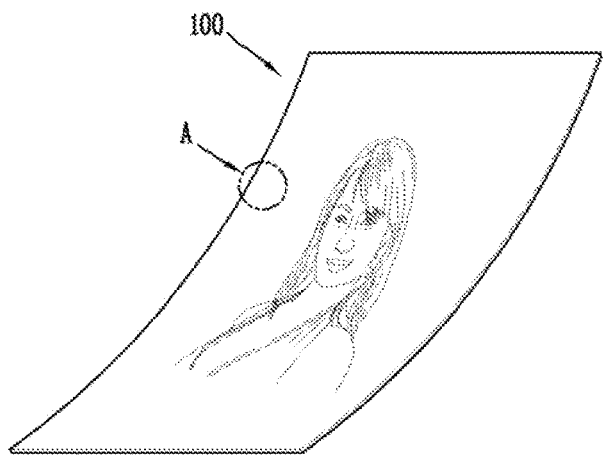
[FIG. 2]
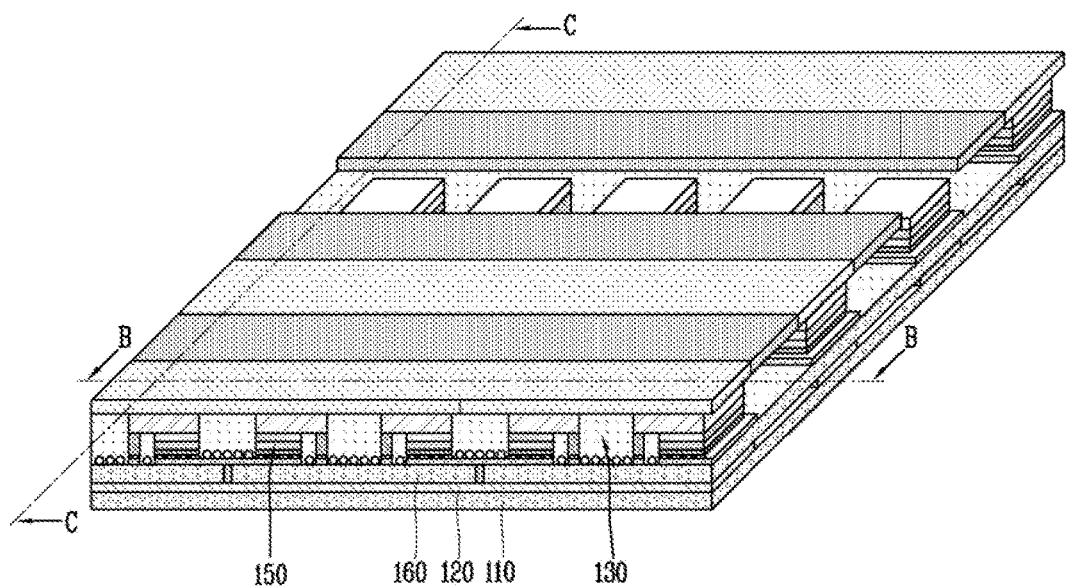

[FIG. 3a]
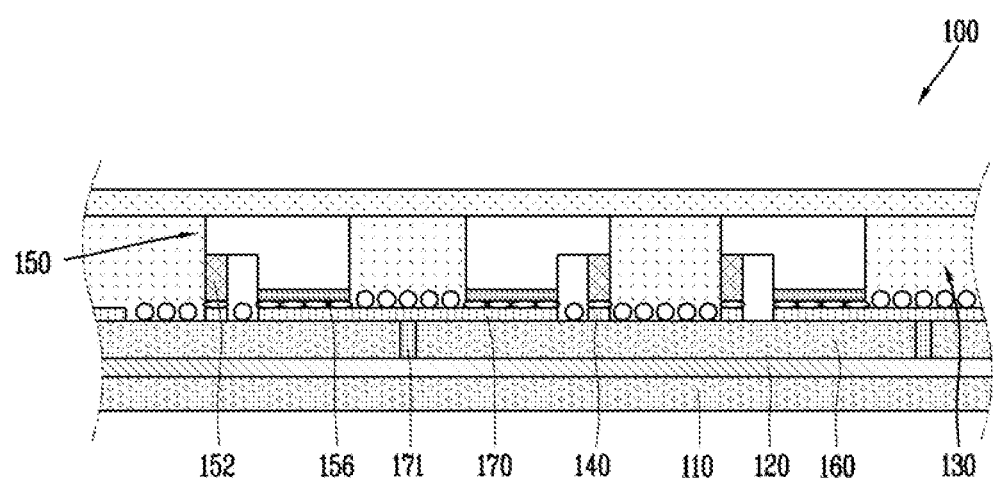
[FIG. 3b]
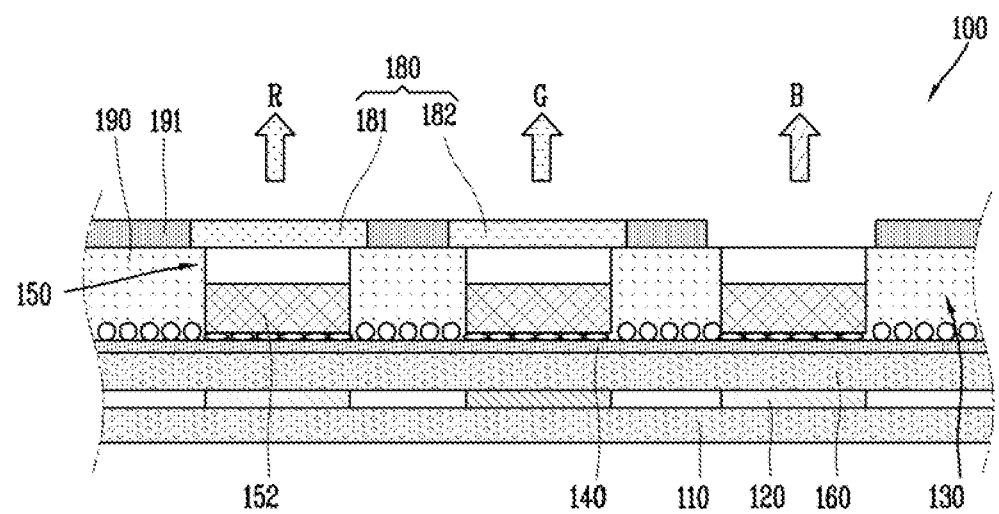

[FIG. 4]
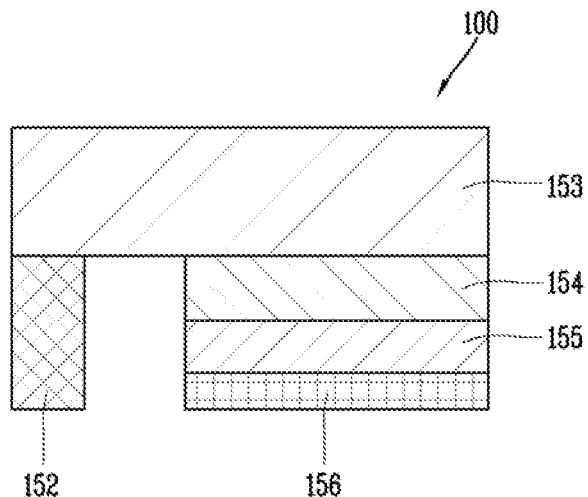
[FIG. 5a]
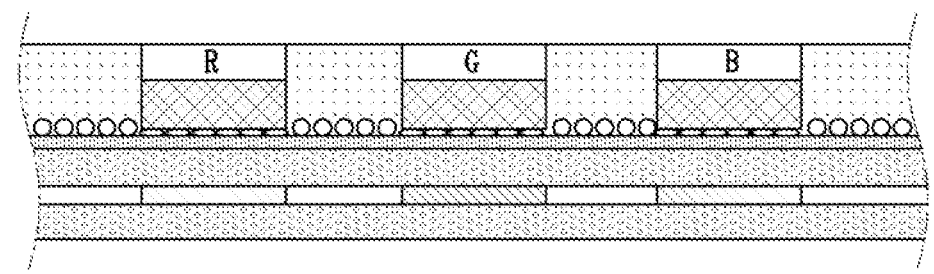
[FIG. 5b]
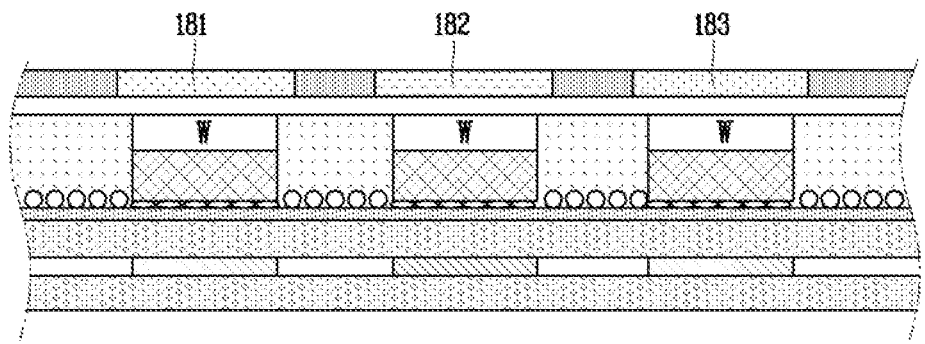

[FIG. 5c]
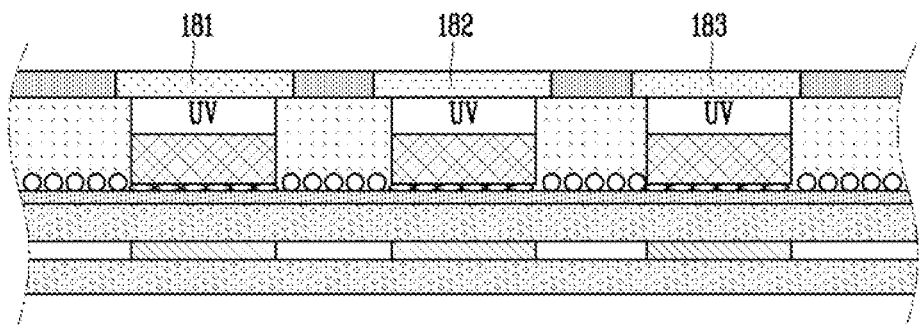

[FIG. 6]
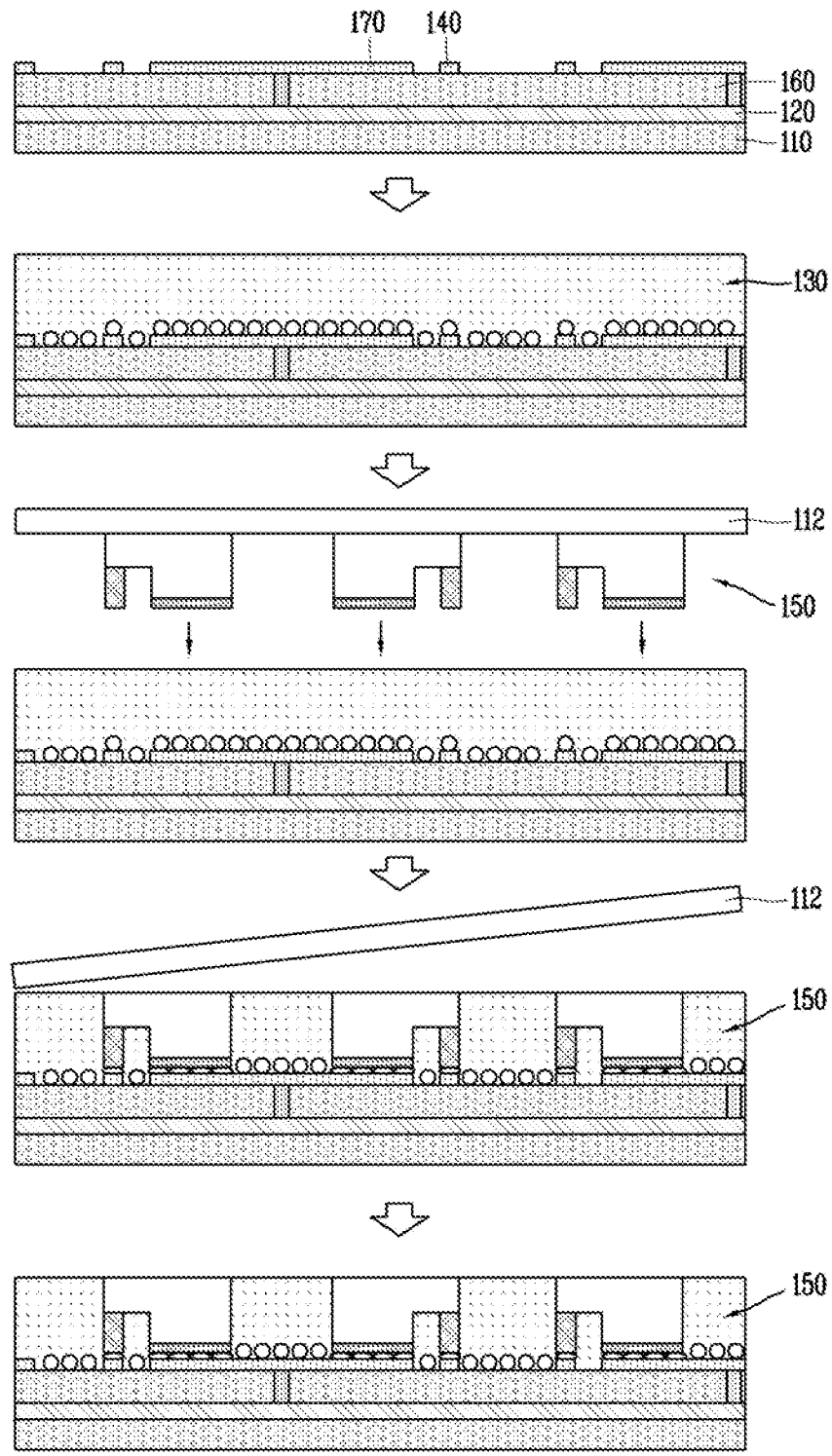

[FIG. 7]
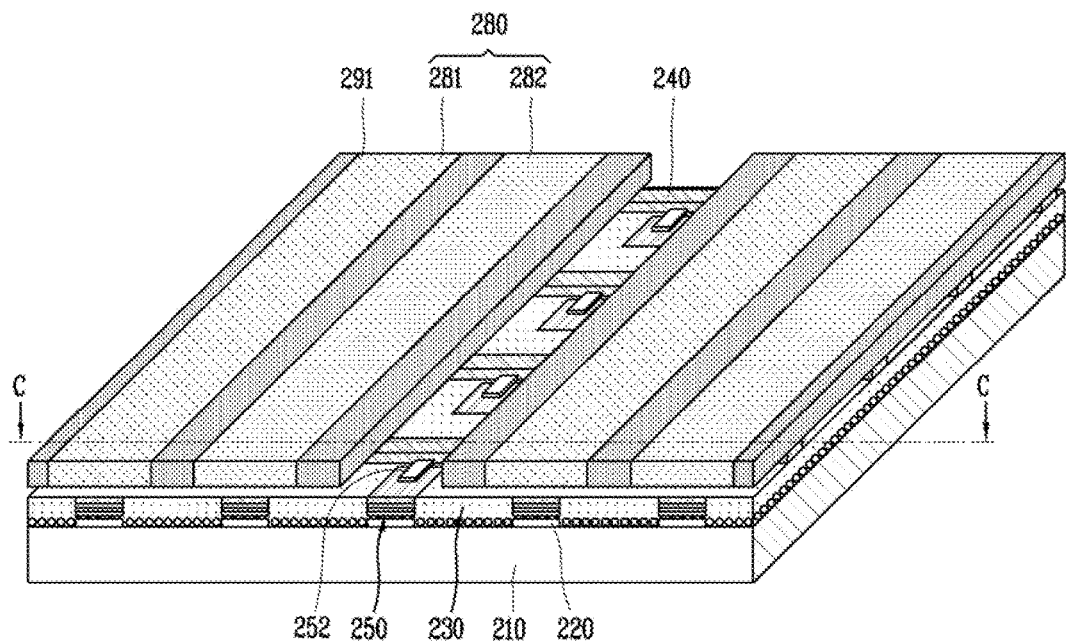
[FIG. 8]
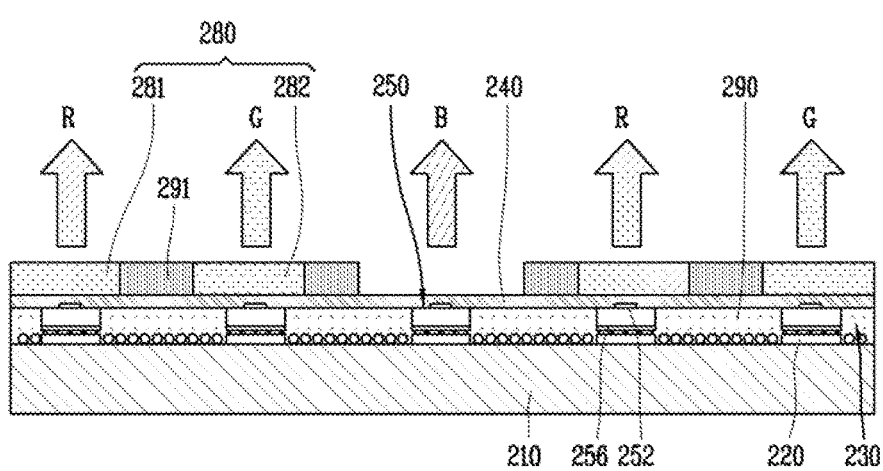

[FIG. 9]
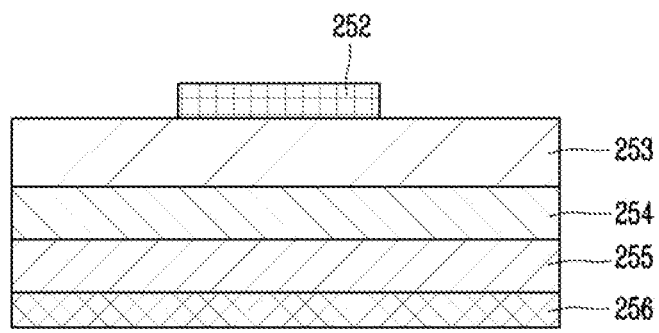
[FIG. 10]
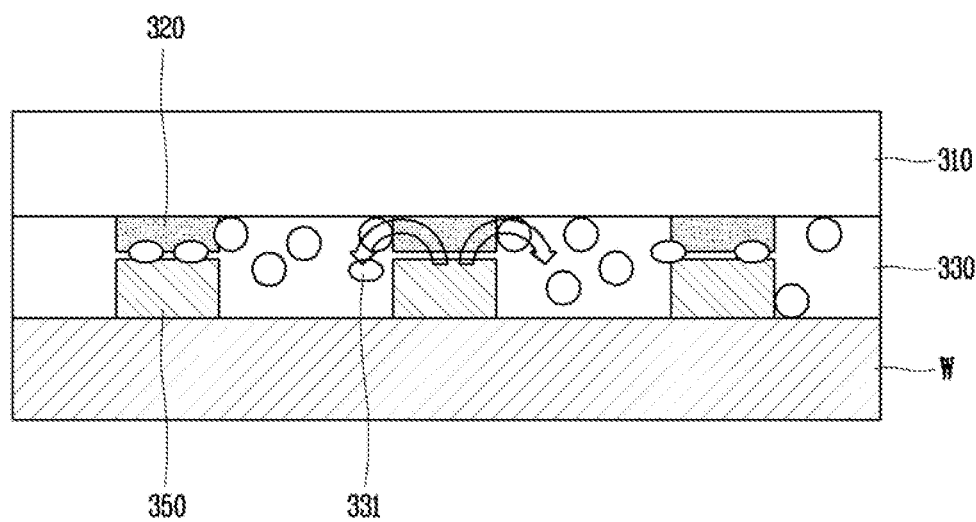
[FIG. 11]
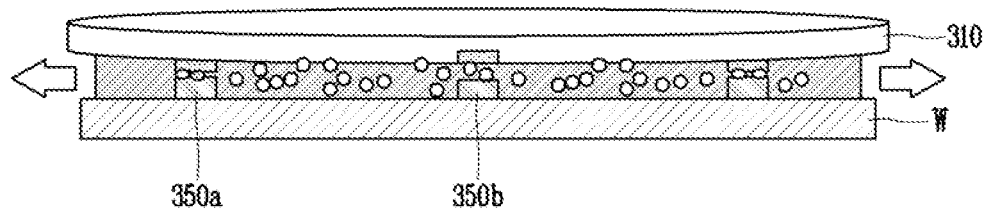

[FIG. 12]
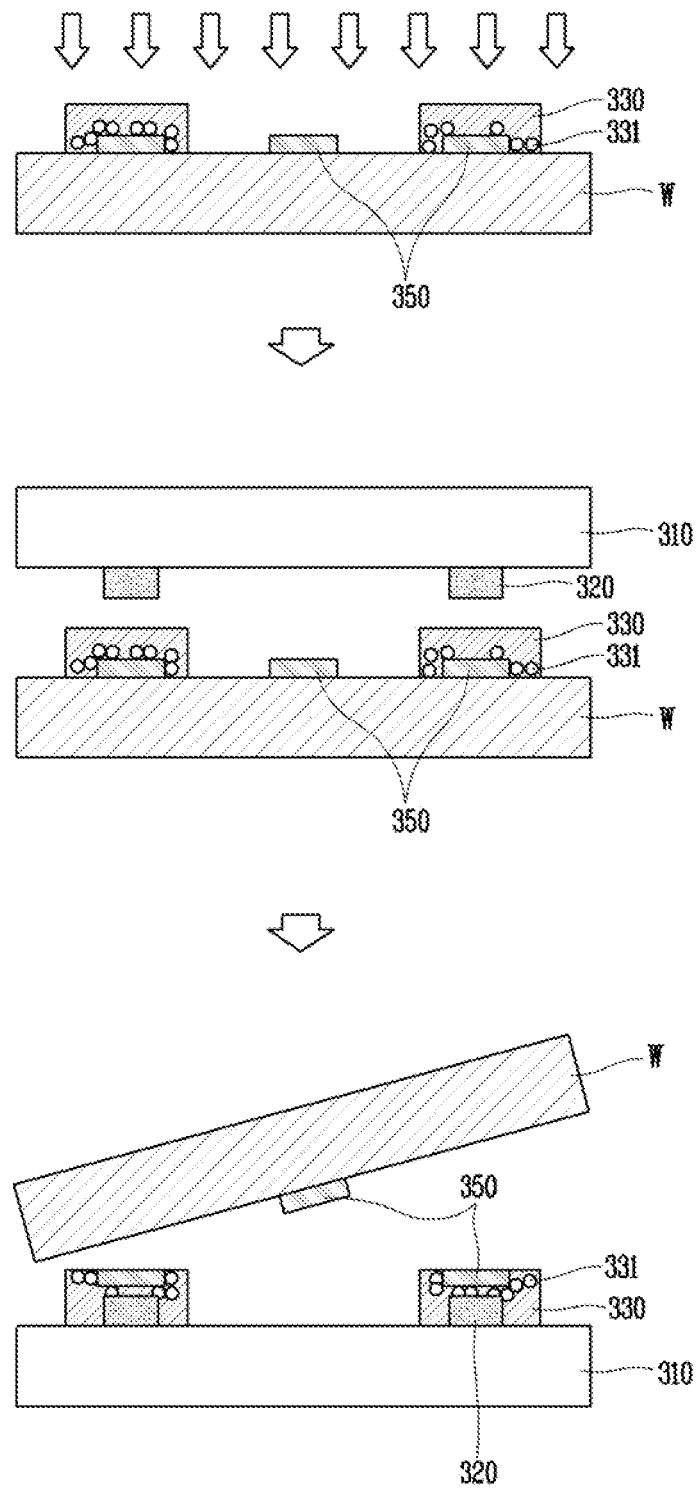

[FIG. 13]
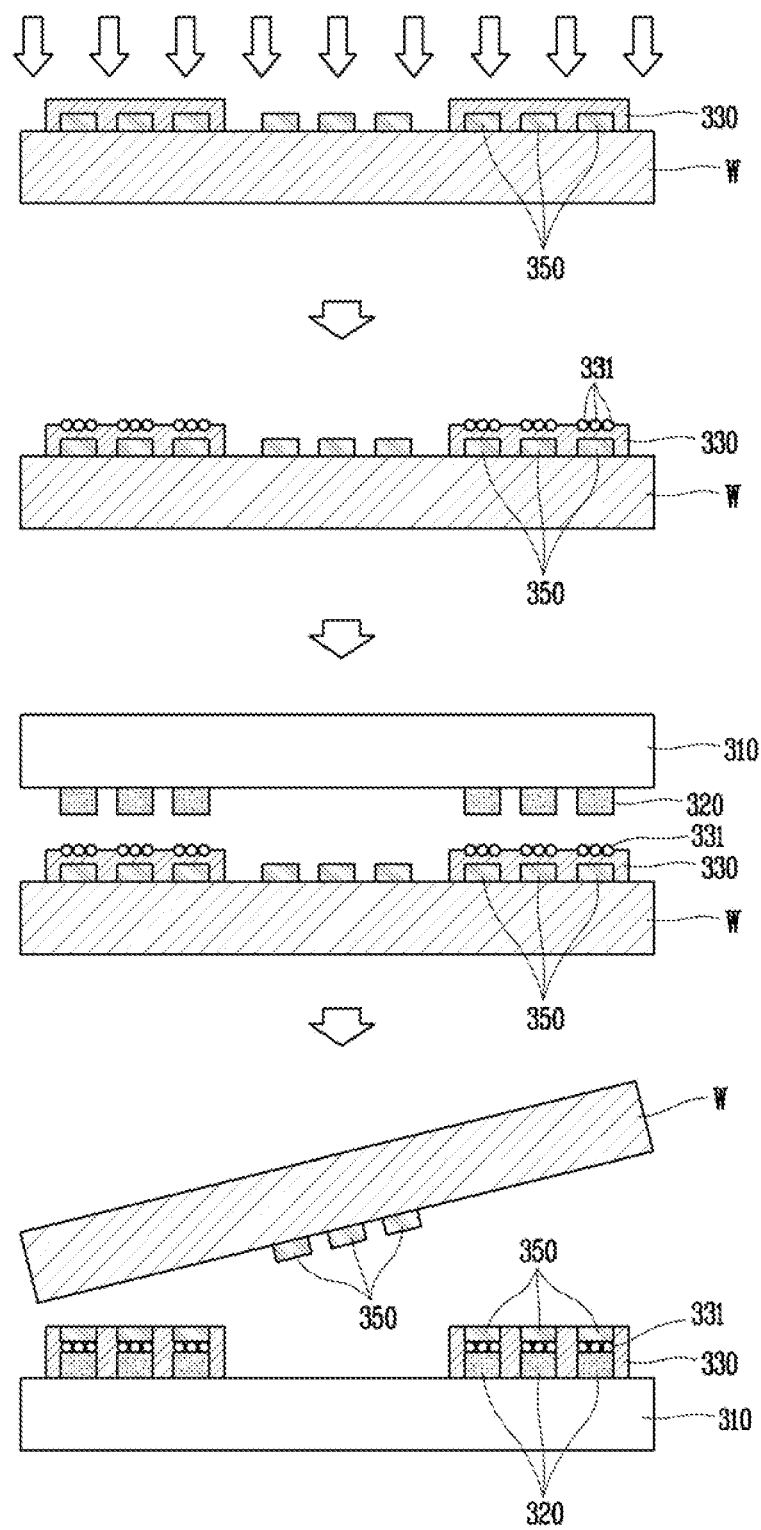

[FIG. 14]
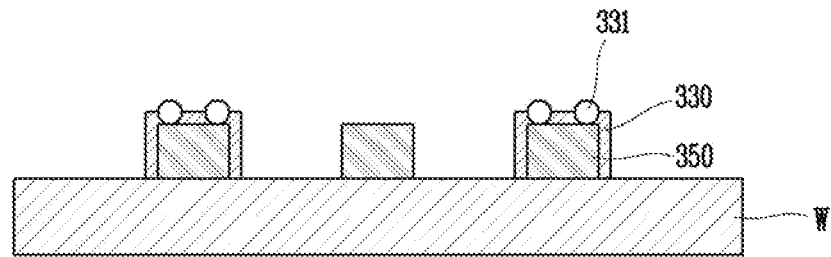
[FIG. 15]
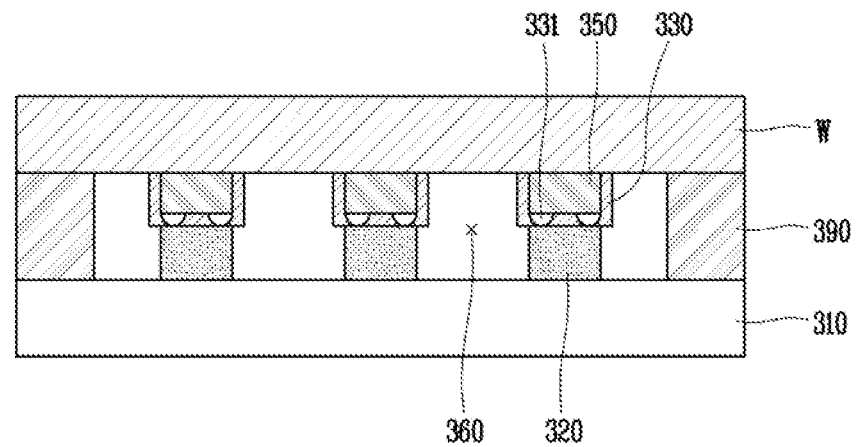
[FIG. 16]
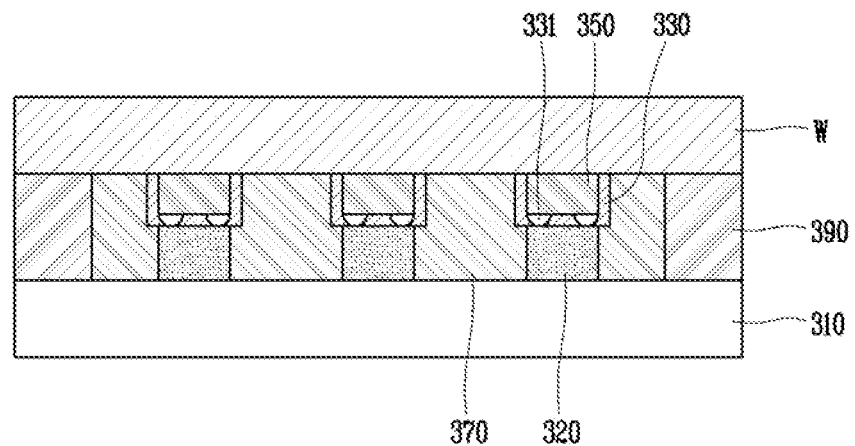

[FIG. 17]
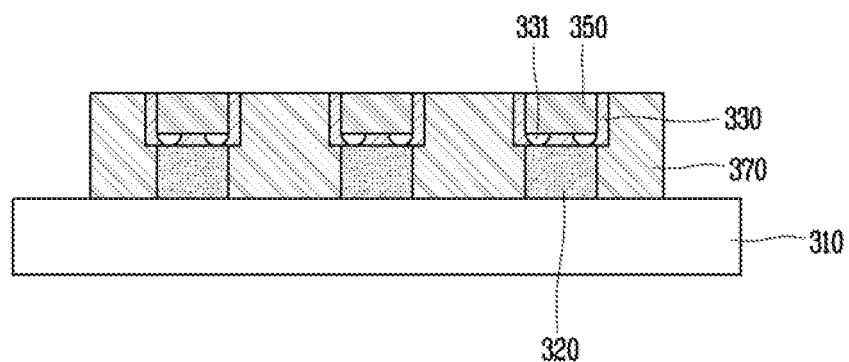

DISPLAY DEVICE USING SEMICONDUCTOR LIGHT-EMITTING ELEMENTS AND METHOD FOR MANUFACTURING SAME

CROSS REFERENCE TO RELATED APPLICATIONS

This application is the National Stage filing under 35 U.S.C. 371 of International Application No. PCT/KR2019/017061, filed on Dec. 5, 2019, the contents of which is hereby incorporated by reference herein in their entirety.

TECHNICAL FIELD

The present invention relates to a display device and a method for manufacturing the same, and more particularly, to a flexible display device using a semiconductor light emitting device.

BACKGROUND ART

Recently, in the field of display technology, display devices having excellent characteristics such as thinness and flexibility have been developed. In contrast, currently commercialized major displays are represented by LCD (Liquid Crystal Display) and AMOLED (Active Matrix Organic Light Emitting Diodes).

However, in the case of LCD, there are problems in that the response time is not fast and flexible implementation is difficult, and in the case of AMOLED, there is a weakness in that the lifespan is short, the mass production yield is not good, and the degree of flexibility is weak.

Meanwhile, a light emitting diode (LED) is a well-known semiconductor light emitting device that converts electric current into light. Starting with the commercialization of a red LED using a GaAsP compound semiconductor in 1962, it has been used as a light source for display images of electronic devices, including information and communication devices, along with GaP:N-based green LEDs. Accordingly, a method for solving the above problems by implementing a flexible display using the semiconductor light emitting device can be proposed.

The semiconductor light emitting device is transferred onto the substrate in various ways. As one of the transfer methods of semiconductor light emitting devices, a transfer method using an anisotropic conductive layer is used. The use of the anisotropic conductive layer has an advantage in that the semiconductor light emitting device and the wiring electrode can be electrically connected only by thermal compression, but there is a problem in that poor contact between the semiconductor light emitting device and the wiring electrode occurs when the area of the wiring substrate increases.

DISCLOSURE

Technical Problem

One object of the present invention is to provide a structure and a manufacturing method for preventing contact failure between a semiconductor light emitting device and a wiring electrode when the semiconductor light emitting device is pressed to a wiring electrode using an anisotropic conductive layer.

Technical Solution

In order to achieve the above object, the present invention provides a display device characterized in that including a substrate, a wiring electrode disposed on the substrate, a plurality of semiconductor light emitting devices electrically connected to the wiring electrode, and an anisotropic conductive layer disposed between the semiconductor light emitting devices and made of a mixture of conductive particles and an insulating material, and a light-transmitting layer formed between the semiconductor light emitting devices. The anisotropic conductive layer includes a plurality of anisotropic conductive layers, and any one of the plurality of anisotropic conductive layers is formed to surround one semiconductor light emitting device or to surround a plurality of semiconductor light emitting devices adjacent to each other.

In an embodiment, the plurality of anisotropic conductive layers can be disposed to be spaced apart from each other.

In an embodiment, the wiring electrode can include a first region overlapping the anisotropic conductive layer and a second region not overlapping the anisotropic conductive layer.

In an embodiment, the second region can overlap the light-transmitting layer.

In an embodiment, the anisotropic conductive layer can be formed to surround a side surface of the semiconductor light emitting device.

The present invention also provides a method of manufacturing a display device by transferring a plurality of semiconductor light emitting devices to a substrate on which wiring electrodes are formed. Specifically, the present invention includes a step of forming an anisotropic conductive layer on at least some of the plurality of semiconductor light emitting devices disposed on the transfer substrate, a step of aligning the substrate on which the wiring electrode is formed with the transfer substrate, a step of pressing the substrate onto the transfer substrate, a step of injecting and curing a light-transmitting resin into an empty space formed between the transfer substrate and the substrate, and a step of removing the transfer substrate.

In an embodiment, the step of forming an anisotropic conductive layer on at least some of the plurality of semiconductor light emitting devices disposed on the transfer substrate can include a step of applying a resin to at least some of the plurality of semiconductor light emitting devices disposed on the transfer substrate, a step of coating conductive particles on the resin-coated semiconductor light emitting device, and a step of curing the applied resin.

In an embodiment, the step of injecting and curing the light-transmitting resin into the empty space formed between the transfer substrate and the substrate can be performed after forming a sealing layer on the edge of the substrate.

Advantageous Effects

In the display device according to the present invention, when the semiconductor light emitting device is pressed onto the wiring substrate, since the flow of the anisotropic conductive layer is minimized, it is possible to prevent the conductive particles from being separated between the semiconductor light emitting device and the wiring electrode. Through this, the present invention can prevent a contact failure between the semiconductor light emitting device and the wiring electrode.

In addition, according to the present invention, when the semiconductor light emitting device is pressed onto the wiring substrate, since the buffer unit maintains a constant distance between the semiconductor light emitting device and the wiring electrode, uniform pressure can be applied to each of the semiconductor light emitting devices even when the wiring substrate is widened.

DESCRIPTION OF DRAWINGS

FIG. 1 is a conceptual diagram showing an embodiment of a display device using a semiconductor light emitting device of the present invention.

FIG. 2 is a partially enlarged view of part A of FIG. 1, and FIGS. 3A and 3B are cross-sectional views taken along lines B-B and C-C of FIG. 2.

FIG. 4 is a conceptual diagram illustrating the flip-chip type semiconductor light emitting device of FIG. 3.

FIGS. 5A to 5C are conceptual views illustrating various forms of implementing colors in relation to a flip-chip type semiconductor light emitting device.

FIG. 6 is a cross-sectional view illustrating a method of manufacturing a display device using the semiconductor light emitting device of the present invention.

FIG. 7 is a perspective view showing another embodiment of a display device using the semiconductor light emitting device of the present invention.

FIG. 8 is a cross-sectional view taken along line D-D-C-C in FIG. 7.

FIG. 9 is a conceptual diagram illustrating the vertical semiconductor light emitting device of FIG. 8.

FIGS. 10 and 11 are conceptual views illustrating problems occurring during compression described in FIG. 6.

FIGS. 12 and 13 are conceptual views illustrating a method of manufacturing a display device according to the present invention.

FIGS. 14 to 16 are conceptual views illustrating a method of transferring a semiconductor light emitting device after forming an anisotropic conductive layer.

FIG. 17 is a cross-sectional view showing a cross section of a display device according to the present invention.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. Also, the attached drawings are only for easy understanding of the embodiments disclosed in the present specification, and should not be construed as limiting the technical idea disclosed herein by the attached drawings.

Also, when an element such as a layer, region or substrate is referred to as being "on" another component, it will be understood that this can be directly on other elements or intervening elements can exist in between.

A display device described in this specification can include a mobile phone, a smart phone, a laptop computer, a digital broadcasting terminal, a personal digital assistant (PDA), a portable multimedia player (PMP), a navigation system, a slate PC, a Tablet PC, an Ultra Book, a digital TV, a digital signage, a head mounted display (HMD), a desktop computer, and the like. However, it will be readily apparent to those skilled in the art that the configuration according to the embodiment described herein can be applied to a display capable device even in a new product form to be developed later.

FIG. 1 is a conceptual diagram showing an embodiment of a display device using a semiconductor light emitting device of the present invention.

As shown, information processed by the controller of the display device 100 can be displayed using a flexible display.

A flexible display includes a display that can be bent, bent, twisted, folded, or rolled by an external force. For example, the flexible display can be a display manufactured on a thin and flexible substrate that can be bent, twisted, folded, or rolled like paper while maintaining the display characteristics of a conventional flat panel display.

In a state in which the flexible display is not bent (for example, a state having an infinite radius of curvature, hereinafter referred to as a first state), the display area of the flexible display becomes a flat surface. In a state bent by an external force in the first state (for example, a state having a finite radius of curvature, hereinafter referred to as a second state), the display area can be a curved surface. As shown, the information displayed in the second state can be visual information output on the curved surface. Such visual information is implemented by independently controlling the light emission of sub-pixels arranged in a matrix form. The unit pixel means a minimum unit for implementation one color.

The unit pixel of the flexible display can be implemented by a semiconductor light emitting device. In the present invention, a light emitting diode (LED) is exemplified as a type of semiconductor light emitting device that converts current into light. The light emitting diode is formed to have a small size, so that it can serve as a unit pixel even in the second state.

Hereinafter, a flexible display implemented using the light emitting diode will be described in more detail with reference to the drawings.

FIG. 2 is a partial enlarged view of part A of FIG. 1, FIGS. 3a and 3b are cross-sectional views taken along lines B-B and C-C in FIG. 2. FIG. 4 is a conceptual diagram illustrating the flip chip type semiconductor light emitting device of FIG. 3A, and FIGS. 5A to 5C are conceptual diagrams illustrating various forms of implementing colors in relation to the flip chip type semiconductor light emitting device.

Referring to FIGS. 2, 3A, and 3B, the display device 100 using a semiconductor light emitting device of a passive matrix (PM) method is exemplified as the display device 100 using a semiconductor light emitting device. However, the examples described below are also applicable to an active matrix (AM) type semiconductor light emitting device.

The display device 100 includes a substrate 110, a first electrode 120, a conductive adhesive layer 130, a second electrode 140, and a plurality of semiconductor light-emitting devices 150.

The substrate 110 can be a flexible substrate. For example, to implement a flexible display device, the substrate 110 can include glass or polyimide (PI). In addition, any material such as PEN (polyethylene naphthalate) or PET (polyethylene terephthalate) can be used as long as it has insulating properties and is flexible. Also, the substrate 110 can be made of either a transparent material or an opaque material.

The substrate 110 can be a wiring substrate on which the first electrode 120 is disposed, and thus the first electrode 120 can be located on the substrate 110.

As shown, the insulating layer 160 can be disposed on the substrate 110 on which the first electrode 120 is positioned, and the auxiliary electrode 170 can be positioned on the insulating layer 160. In this case, a state in which the insulating layer 160 is laminated on the substrate 110 can be a single wiring substrate. More specifically, the insulating layer 160 can be made of an insulating and flexible material such as polyimide (PI, Polyimide), PET, or PEN, and can be formed integrally with the substrate 110 to form a single substrate.

The auxiliary electrode 170 is an electrode that electrically connects the first electrode 120 and the semiconductor light emitting device 150, the auxiliary electrode 170 is located on the insulating layer 160, and the auxiliary electrode 170 is disposed to correspond to the position of the first electrode 120. For example, the auxiliary electrode 170 can have a dot shape and can be electrically connected to the first electrode 120 by an electrode hole 171 penetrating the insulating layer 160. The electrode hole 171 can be formed by filling a via hole with a conductive material.

Referring to the drawings, the conductive adhesive layer 130 is formed on one surface of the insulating layer 160, but the present invention is not necessarily limited thereto. For example, a layer performing a specific function can be formed between the insulating layer 160 and the conductive adhesive layer 130, or a structure in which the conductive adhesive layer 130 is disposed on the substrate 110 without the insulating layer 160 is also possible. In a structure in which the conductive adhesive layer 130 is disposed on the substrate 110, the conductive adhesive layer 130 can serve as an insulating layer.

The conductive adhesive layer 130 can be a layer having adhesiveness and conductivity, and for this purpose, a material having conductivity and a material having adhesiveness can be mixed in the conductive adhesive layer 130. In addition, the conductive adhesive layer 130 has ductility, thereby enabling a flexible function in the display device.

For this example, the conductive adhesive layer 130 can be an anisotropic conductive film (ACF), an anisotropic conductive paste, a solution containing conductive particles, or the like. The conductive adhesive layer 130 can be configured as a layer that allows electrical interconnection in the Z direction passing through the thickness, but has electrical insulation in the horizontal X-Y direction. Accordingly, the conductive adhesive layer 130 can be referred to as a Z-axis conductive layer (however, hereinafter referred to as a 'conductive adhesive layer').

The anisotropic conductive film is a film in which an anisotropic conductive medium is mixed with an insulating base member, and when heat and pressure are applied, only a specific portion has conductivity by the anisotropic conductive medium. Hereinafter, it will be described that heat and pressure are applied to the anisotropic conductive film, but other methods are also possible in order for the anisotropic conductive film to have partial conductivity. In this method, for example, only one of the above heat and pressure can be applied or UV curing can be performed.

Also, the anisotropic conductive medium can be, for example, conductive balls or conductive particles. As shown, in this example, the anisotropic conductive film is a film in which conductive balls are mixed with an insulating base member, and when heat and pressure are applied, only a specific portion has conductivity by the conductive balls. The anisotropic conductive film can be in a state in which a core of a conductive material contains a plurality of particles covered by an insulating film made of a polymer material. In this case, the portion to which heat and pressure is applied has conductivity due to the core as the insulating film is destroyed. At this time, the shape of the core can be deformed to form a layer in contact with each other in the thickness direction of the film. As a more specific example, heat and pressure are applied as a whole to the anisotropic conductive film, and an electrical connection in the Z-axis direction is partially formed due to a height difference of an object adhered by the anisotropic conductive film.

As another example, the anisotropic conductive film can be in a state in which an insulating core contains a plurality of particles coated with a conductive material. In this case, the conductive material is deformed (pressed) in the portion to which heat and pressure are applied, and thus has conductivity in the thickness direction of the film. As another example, a form in which the conductive material penetrates the insulating base member in the Z-axis direction to have conductivity in the thickness direction of the film is also possible. In this case, the conductive material can have a pointed end.

As shown, the anisotropic conductive film can be a fixed array anisotropic conductive film (ACF) in which a conductive ball is inserted into one surface of an insulating base member. More specifically, the insulating base member is formed of an adhesive material, the conductive balls are intensively disposed on the bottom portion of the insulating base member, and when heat and pressure are applied from the base member, the conductive balls are deformed together with the conductive balls to have conductivity in the vertical direction.

However, the present invention is not necessarily limited thereto. The anisotropic conductive film can have a form in which conductive balls are randomly mixed in an insulating base member, or a form in which conductive balls are arranged in one layer (double-ACF), which is composed of a plurality of layers, and the like.

The anisotropic conductive paste is a combination of a paste and a conductive ball, and can be a paste in which a conductive ball is mixed with an insulating and adhesive base material. Also, a solution containing conductive particles can be a solution containing conductive particles or nano-particles.

Referring back to the drawings, the second electrode 140 is spaced apart from the auxiliary electrode 170 and is located in the insulating layer 160. That is, the conductive adhesive layer 130 is disposed on the insulating layer 160 in which the auxiliary electrode 170 and the second electrode 140 are located.

In a state in which the auxiliary electrode 170 and the second electrode 140 are positioned on the insulating layer 160, after forming the conductive adhesive layer 130, when the semiconductor light emitting device 150 is connected in a flip chip shape by applying heat and pressure, the semiconductor light emitting device 150 is electrically connected to the first electrode 120 and the second electrode 140.

Referring to FIG. 4, the semiconductor light emitting device can be a flip chip type light emitting device.

For example, the semiconductor light emitting device includes the p-type electrode 156, the p-type semiconductor layer 155 on which the p-type electrode 156 is formed, the active layer 154 formed on the p-type semiconductor layer 155, the n-type semiconductor layer 153 formed on the active layer 154 and the n-type electrode 152 spaced apart from the p-type electrode 156 in the horizontal direction on the n-type semiconductor layer 153. In this case, the p-type electrode 156 can be electrically connected to the auxiliary electrode 170 and the conductive adhesive layer 130, and the n-type electrode 152 can be electrically connected to the second electrode 140.

Referring back to FIGS. 2, 3A, and 3B, the auxiliary electrode 170 is formed to be elongated in one direction, so that one auxiliary electrode can be electrically connected to the plurality of semiconductor light emitting devices 150. For example, p-type electrodes of left and right semiconductor light emitting devices with respect to the auxiliary electrode can be electrically connected to one auxiliary electrode.

More specifically, the semiconductor light emitting device 150 is press-fitted into the conductive adhesive layer 130 by heat and pressure. Through this, only the portion between the p-type electrode 156 and the auxiliary electrode 170 of the semiconductor light emitting device 150 and the portion between the n-type electrode 152 and the second electrode 140 of the semiconductor light emitting device 150 have conductivity, and there is no press-fitting of the semiconductor light emitting device, so it does not have conductivity in the remaining part.

In addition, the plurality of semiconductor light emitting devices 150 constitute a light emitting device array, and the phosphor layer 180 is formed on the light emitting device array.

The light emitting device array can include a plurality of semiconductor light emitting devices having different luminance values. Each semiconductor light emitting device 150 constitutes a unit pixel and is electrically connected to the first electrode 120. For example, the first 120 can be plurality, the semiconductor light emitting devices are arranged in, for example, several rows, and the semiconductor light emitting devices in each column can be electrically connected to any one of the plurality of first electrodes.

Also, since the semiconductor light emitting devices are connected in a flip-chip form, semiconductor light emitting devices grown on a transparent dielectric substrate can be used. In addition, the semiconductor light emitting devices can be, for example, nitride semiconductor light emitting devices. Since the semiconductor light emitting device 150 has excellent luminance, individual unit pixels can be configured even with a small size.

As shown, the barrier walls 190 can be formed between the semiconductor light emitting devices 150. In this case, the barrier wall 190 can serve to separate individual unit pixels from each other, and can be integrally formed with the conductive adhesive layer 130. For example, by inserting the semiconductor light emitting device 150 into the anisotropic conductive film, the base member of the anisotropic conductive film can form the barrier wall.

In addition, when the base member of the anisotropic conductive film is black, the barrier wall 190 can have reflective properties and increase contrast even without a separate black insulator.

As another example, a reflective barrier wall can be separately provided as the barrier wall 190. In this case, the barrier wall 190 can include a black or white insulator depending on the purpose of the display device. When the barrier wall made of a white insulator are used, reflectivity can be increased, and when the barrier walls made of a black insulator are used, it is possible to have reflective properties and increase contrast.

The phosphor layer 180 can be located on the outer surface of the semiconductor light emitting device 150. For example, the semiconductor light emitting device 150 is a blue semiconductor light emitting device that emits blue (B) light, and the phosphor layer 180 performs a function of converting the blue (B) light into the color of a unit pixel. The phosphor layer 180 can be a red phosphor 181 or a green phosphor 182 constituting an individual pixel.

That is, a red phosphor 181 capable of converting blue light into red (R) light can be stacked on the blue semiconductor light emitting device 151 at a position constituting the red unit pixel, a green phosphor 182 capable of converting blue light into green (G) light can be stacked on the blue semiconductor light emitting device 151 at a position forming the green unit pixel. In addition, only the blue semiconductor light emitting device 151 can be used alone in the portion constituting the blue unit pixel. In this case, unit pixels of red (R), green (G), and blue (B) can form one pixel. More specifically, a phosphor of one color can be stacked along each line of the first electrode 120. Accordingly, one line in the first electrode 120 can be an electrode for controlling one color. That is, red (R), green (G), and blue (B) can be sequentially disposed along the second electrode 140, thereby a unit pixel can be implemented.

However, the present invention is not necessarily limited thereto, instead of the phosphor, the semiconductor light emitting device 150 and the quantum dot (QD) are combined to implement unit pixels of red (R), green (G), and blue (B).

In addition, a black matrix 191 can be disposed between each of the phosphor layers to improve contrast. That is, the black matrix 191 can improve contrast of light and dark.

However, the present invention is not necessarily limited thereto, and other structures for implementing blue, red, and green colors can be applied.

Referring to FIG. 5A, each semiconductor light emitting device 150 is mainly made of gallium nitride (GaN), and indium (In) and/or aluminum (Al) is added together to be implemented as a high power light emitting device that emits various light including blue.

In this case, the semiconductor light emitting device 150 can be a red, green, and blue semiconductor light emitting device to form a sub-pixel, respectively. For example, red, green, and blue semiconductor light emitting devices R, G, and B are alternately disposed, and unit pixels of red, green, and blue colors by the red, green and blue semiconductor light emitting devices can form one pixel. Through this, a full color display can be implemented.

Referring to FIG. 5B, the semiconductor light emitting device can include a white light emitting device W in which a yellow phosphor layer is provided for each device. In this case, a red phosphor layer 181, a green phosphor layer 182, and a blue phosphor layer 183 can be provided on the white light emitting device W to form a unit pixel. In addition, a unit pixel can be formed on the white light emitting device W by using a color filter in which red, green, and blue are repeated.

Referring to FIG. 5C, a structure in which a red phosphor layer 181, a green phosphor layer 182, and a blue phosphor layer 183 are provided on the ultraviolet light emitting device UV is also possible. In this way, the semiconductor light emitting device can be used in the entire region not only for visible light but also for ultraviolet (UV) light, and can be extended in the form of a semiconductor light emitting device in which ultraviolet (UV) can be used as an excitation source of the upper phosphor.

Referring back to this example, the semiconductor light emitting device 150 is positioned on the conductive adhesive layer 130 to constitute a unit pixel in the display device. Since the semiconductor light emitting device 150 has excellent luminance, individual unit pixels can be configured even with a small size. The size of the individual semiconductor light emitting device 150 can have a side length of 80 µm or less, and can be a rectangular or square device. In the case of a rectangle, the size can be 20×80 µm or less.

In addition, even when a square semiconductor light emitting device 150 having a side length of 10 µm is used as a unit pixel, sufficient brightness to form a display device appears. Accordingly, for example, when the unit pixel is a rectangular pixel having one side of 600 µm and the other side of 300 µm, the distance between the semiconductor light emitting devices is relatively large. Accordingly, in this case, it is possible to implement a flexible display device having HD image quality.

The display device using the semiconductor light emitting device described above can be manufactured by a new type of manufacturing method. Hereinafter, the manufacturing method will be described with reference to FIG. 6.

FIG. 6 is a cross-sectional view illustrating a method of manufacturing a display device using a semiconductor light emitting device of the present invention.

Referring to this figure, first, the conductive adhesive layer 130 is formed on the insulating layer 160 on which the auxiliary electrode 170 and the second electrode 140 are positioned. An insulating layer 160 is laminated on the first substrate 110 to form one substrate (or wiring board), and the wiring substrate includes a first electrode 120, an auxiliary electrode 170, and a second electrode 140. In this case, the first electrode 120 and the second electrode 140 may be disposed in a mutually orthogonal direction. In addition, in order to implement a flexible display device, the first substrate 110 and the insulating layer 160 may each include glass or polyimide (PO.

The conductive adhesive layer 130 can be implemented by, for example, an anisotropic conductive film, and for this purpose, the anisotropic conductive film can be applied to the substrate on which the insulating layer 160 is located.

Next, the second substrate 112 is provided with a plurality of semiconductor light emitting devices 150 corresponding to the positions of the auxiliary electrode 170 and the second electrodes 140 and constituting the individual pixels, and the second substrate 112 is disposed such that the semiconductor light emitting device 150 faces the auxiliary electrode 170 and the second electrode 140.

In this case, the second substrate 112 is a growth substrate on which the semiconductor light emitting device 150 is grown, and can be a sapphire substrate or a silicon substrate.

When the semiconductor light emitting device is formed in units of wafers, the semiconductor light emitting device can be effectively used in a display device by having an interval and a size that can form a display device.

Next, the wiring substrate and the second substrate 112 are thermal compression. For example, the wiring substrate and the second substrate 112 can be thermal compression by applying an ACF press head. The wiring substrate and the second substrate 112 are bonded by the thermal compression. By thermal compression, only a portion between the semiconductor light emitting device 150 and the auxiliary electrode 170 and the second electrode 140 has conductivity due to the properties of the anisotropic conductive film having conductivity. Through this, the electrodes and the semiconductor light emitting device 150 can be electrically connected. At this time, the semiconductor light emitting device 150 is inserted into the anisotropic conductive film, and through this, a barrier wall can be formed between the semiconductor light emitting devices 150.

Next, the second substrate 112 is removed. For example, the second substrate 112 can be removed using a laser lift-off (LLO) method or a chemical lift-off (CLO) method.

Finally, the second substrate 112 is removed to expose the semiconductor light emitting devices 150 to the outside. If necessary, a transparent insulating layer (not shown) can be formed by coating silicon oxide (SiOx) or the like on the wiring substrate to which the semiconductor light emitting device 150 is coupled.

In addition, the method can further include forming a phosphor layer on one surface of the semiconductor light emitting device 150. For example, the semiconductor light emitting device 150 is a blue semiconductor light emitting device that emits blue (B) light. And a red phosphor or a green phosphor for converting the blue (B) light into the color of the unit pixel can form a layer on one surface of the blue semiconductor light emitting device.

The manufacturing method or structure of the display device using the semiconductor light emitting device described above can be modified in various forms. As an example, a vertical semiconductor light emitting device can also be applied to the display device described above. Hereinafter, a vertical structure will be described with reference to FIGS. 5 and 6.

In addition, in the modification or embodiment described below, the same or similar reference numerals are assigned to the same or similar components as in the previous example, and the description is replaced with the first description.

FIG. 7 is a perspective view showing another embodiment of the display device using the semiconductor light emitting device of the present invention, FIG. 8 is a cross-sectional view taken along line D-D-C-C of FIG. 7, and FIG. 9 is a conceptual view illustrating the vertical semiconductor light emitting device of FIG. 8.

Referring to the drawings, the display device can be a display device using a passive matrix (PM) type vertical semiconductor light emitting device.

The display device includes a substrate 210, a first electrode 220, a conductive adhesive layer 230, a second electrode 240, and a plurality of semiconductor light emitting devices (250).

The substrate 210 is a wiring substrate on which the first electrode 220 is disposed, and can include polyimide (PI) to implement a flexible display device. In addition, any material that has insulating properties and is flexible can be used.

The first electrode 220 can be positioned on the substrate 210, and can be formed as a bar-shaped electrode long in one direction. The first electrode 220 can serve as a data electrode.

The conductive adhesive layer 230 is formed on the substrate 210 on which the first electrode 220 is located. Like a display device to which a flip chip type light emitting device is applied, the conductive adhesive layer 230 can be an anisotropic conductive film (ACF), an anisotropic conductive paste, a solution containing conductive particles, or the like. However, in this embodiment as well, a case in which the conductive adhesive layer 230 is implemented by an anisotropic conductive film is exemplified.

After positioning the anisotropic conductive film in a state in which the first electrode 220 is positioned on the substrate 210, when the semiconductor light emitting device 250 is connected by applying heat and pressure, the semiconductor light emitting device 250 is electrically connected to the first electrode 220. In this case, the semiconductor light emitting device 250 is preferably disposed on the first electrode 220.

As described above, when heat and pressure are applied to the anisotropic conductive film, the electrical connection is partially generated because it has conductivity in the thickness direction. Accordingly, the anisotropic conductive film is divided into a conductive portion and a non-conductive portion in the thickness direction.

In addition, since the anisotropic conductive film contains an adhesive component, the conductive adhesive layer 230 implements not only electrical connection but also mechanical bonding between the semiconductor light emitting device 250 and the first electrode 220.

As describe above, the semiconductor light emitting device 250 is positioned on the conductive adhesive layer 230, and through this, constitutes an individual pixel in the display device. Since the semiconductor light emitting device 250 has excellent luminance, individual unit pixels can be configured even with a small size. The size of the individual semiconductor light emitting device 250 can have a side length of 80 μm or less, and can be a rectangular or square device. In the case of a rectangle, the size can be 20×80 μm or less.

The semiconductor light emitting device 250 can have a vertical structure.

Between the vertical semiconductor light emitting devices, a plurality of second electrodes 240 are disposed in a direction crossing the longitudinal direction of the first electrode 220 and electrically connected to the vertical semiconductor light emitting device 250.

Referring to FIG. 9, such a vertical semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254 and an n-type electrode 252 formed on the n-type semiconductor layer 253. In this case, the lower p-type electrode 256 can be electrically connected to the first electrode 220 and the conductive adhesive layer 230, and the n-type electrode 252 located on the upper portion can be electrically connected to a second electrode 240 to be described later. The vertical semiconductor light emitting device 250 has a great advantage in that it is possible to reduce the size of a chip because electrodes can be arranged up and down.

Referring back to FIG. 8, a phosphor layer 280 can be formed on one surface of the semiconductor light emitting device 250. For example, the semiconductor light emitting device 250 can be a blue semiconductor light emitting device 251 emitting blue (B) light, and a phosphor layer 280 for converting the blue (B) light into the color of a unit pixel can be provided. In this case, the phosphor layer 280 can be a red phosphor 281 and a green phosphor 282 constituting individual pixels.

That is, a red phosphor 281 capable of converting blue light into red (R) light can be stacked on the blue semiconductor light emitting device 251 at a position forming the red unit pixel. And a green phosphor 282 capable of converting blue light into green (G) light can be stacked on the blue semiconductor light emitting device 251 at a position forming the green unit pixel. In addition, only the blue semiconductor light emitting device 251 can be used alone in a portion constituting the blue unit pixel. In this case, unit pixels of red (R), green (G), and blue (B) can form one pixel.

However, the present invention is not necessarily limited thereto, and as described above in a display device to which a flip chip type light emitting device is applied, other structures for implementation blue, red, and green can be applied.

Referring to this embodiment again, the second electrode 240 is positioned between the semiconductor light emitting devices 250 and is electrically connected to the semiconductor light emitting devices 250. For example, the semiconductor light emitting devices 250 can be arranged in a plurality of columns, and the second electrode 240 can be positioned between the columns of the semiconductor light emitting devices 250.

Since the distance between the semiconductor light emitting devices 250 constituting individual pixels is sufficiently large, the second electrode 240 can be positioned between the semiconductor light emitting devices 250.

The second electrode 240 can be formed as a long bar-shaped electrode in one direction, and can be disposed in a direction perpendicular to the first electrode.

In addition, the second electrode 240 and the semiconductor light emitting device 250 can be electrically connected to each other by a connection electrode protruding from the second electrode 240. More specifically, the connection electrode can be an n-type electrode of the semiconductor light emitting device 250. For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 can be electrically connected.

As shown, the second electrode 240 can be positioned on the conductive adhesive layer 230. In some cases, a transparent insulating layer (not shown) including silicon oxide (SiOx) can be formed on the substrate 210 on which the semiconductor light emitting device 250 is formed. When the second electrode 240 is positioned after the transparent insulating layer is formed, the second electrode 240 is positioned on the transparent insulating layer. In addition, the second electrode 240 can be formed to be spaced apart from the conductive adhesive layer 230 or the transparent insulating layer.

If a transparent electrode such as indium tin oxide (ITO) is used to position the second electrode 240 on the semiconductor light emitting device 250, the ITO material has a problem of poor adhesion to the n-type semiconductor layer. Accordingly, the present invention has the advantage of not using a transparent electrode such as ITO by locating the second electrode 240 between the semiconductor light emitting devices 250. Therefore, it is possible to improve light extraction efficiency by using a conductive material having good adhesion to the n-type semiconductor layer as a horizontal electrode without being limited by the selection of a transparent material.

As shown, a barrier wall 290 can be positioned between the semiconductor light emitting devices 250. That is, a barrier wall 290 can be disposed between the vertical semiconductor light emitting devices 250 to isolate the semiconductor light emitting devices 250 constituting individual pixels. In this case, the barrier wall 290 can serve to separate individual unit pixels from each other, and can be integrally formed with the conductive adhesive layer 230. For example, by inserting the semiconductor light emitting device 250 into the anisotropic conductive film, the base member of the anisotropic conductive film can form the barrier wall.

In addition, if the base member of the anisotropic conductive film is black, even without a separate black insulator, the barrier wall 290 can have a reflective characteristic and a contrast ratio can be increased.

As another example, as the barrier wall 190, a reflective barrier wall can be separately provided. The barrier wall 290 can include a black or white insulator depending on the purpose of the display device.

If the second electrode 240 is directly positioned on the conductive adhesive layer 230 between the semiconductor light emitting devices 250, the barrier wall 290 can be positioned between the vertical semiconductor light emitting device 250 and the second electrode 240. Accordingly, there is effects that individual unit pixels can be configured even with a small size by using the semiconductor light emitting device 250, since the distance between the semiconductor light emitting devices 250 is relatively large enough, the second electrode 240 can be positioned between the semiconductor light emitting devices 250, and there is an effect that a flexible display device having HD image quality can be implemented.

Also, as shown, a black matrix 291 can be disposed between each phosphor in order to improve a contrast ratio. That is, the black matrix 291 can improve contrast of light and dark.

As described above, the semiconductor light emitting device 250 is positioned on the conductive adhesive layer 230 and constitutes individual pixels in the display device through this. Since the semiconductor light emitting device 250 has excellent luminance, individual unit pixels can be configured even with a small size. Accordingly, a full-color display in which unit pixels of red (R), green (G), and blue (B) constitute one pixel can be implemented by the semiconductor light emitting device.

An anisotropic conductive film (ACF) is utilized in the display device described above. The anisotropic conductive film (hereinafter, anisotropic conductive layer) can be made of a mixture of conductive balls (hereinafter, conductive particles) and an insulating material. As described in FIG. 6, when the substrate on which the semiconductor light emitting device is formed is thermally compressed on the wiring substrate coated with the anisotropic conductive layer, the wiring electrode and the semiconductor light emitting device are electrically connected by conductive particles.

During thermal compression, the conductive particles are compressed between the semiconductor light emitting device and the wiring electrode to electrically connect the semiconductor light emitting device and the wiring electrode. In order to electrically connect the semiconductor light emitting device and the wiring electrode, a certain level of pressure or more should be applied to the conductive particles.

Referring to FIG. 10, due to fluidity of the anisotropic conductive layer 330 during thermal compression, poor contact between the semiconductor light emitting device 350 and the wiring electrode 320 can occur. Specifically, during thermal compression, the conductive particles 331 should be located between the semiconductor light emitting device 350 and the wiring electrode 320, but the conductive particles 331 do not stay between the semiconductor light emitting device 350 and the wiring electrode 320 and can move due to external pressure. In this case, the semiconductor light emitting device 350 and the wiring electrode 320 are incompletely electrically connected.

Meanwhile, referring to FIG. 11, as the area of the wiring substrate 310 increases, the pressure applied to each area of the wiring substrate 110 during thermal compression becomes non-uniform. Specifically, when the area of the wiring substrate is large, a relatively high pressure is applied to the edge region of the wiring substrate, and a relatively low pressure is applied to the central region of the wiring substrate. For this reason, in the edge region of the wiring substrate, the conductive particles are completely pressed to the wiring electrode and the semiconductor light emitting device, but in the central region of the wiring substrate, sufficient pressure is not applied to the conductive particles, resulting in poor contact between the wiring electrode and the semiconductor light emitting devices 350a, 350b.

The present invention can provide a structure and a manufacturing method for preventing the conductive particles from being separated between a semiconductor light emitting device and a wiring electrode during the above-described thermal compression and applying a uniform pressure to the entire wiring substrate.

First, a method for manufacturing a display device according to the present invention will be described.

FIGS. 12 to 15 are conceptual views illustrating a method of manufacturing a display device according to the present invention.

First, a step of forming an anisotropic conductive layer on at least some of the plurality of semiconductor light emitting devices 350 disposed on the transfer substrate W is performed.

The transfer substrate W can be a wafer on which the semiconductor light emitting device 350 is formed, or a substrate onto which the semiconductor light emitting device 350 is primarily transferred from the wafer. In the present invention, an anisotropic conductive layer is formed on the transfer substrate W. The step of forming the anisotropic conductive layer can be performed in two different ways.

Referring to FIG. 12, the forming of the anisotropic conductive layer can be performed by applying a mixture of a light-transmitting resin and conductive particles on a transfer substrate.

The mixture can be selectively applied only to the region where the semiconductor light emitting device is formed. To this end, the step of applying the mixture can be performed through screen printing.

Meanwhile, the mixture cannot be applied to some of the semiconductor light emitting devices 350 disposed on the transfer substrate W. The anisotropic conductive layer is not formed on the semiconductor light emitting device to which the mixture is not applied. Accordingly, the semiconductor light emitting device to which the mixture is not applied is not transferred to a substrate on which a wiring electrode, which will be described later is formed.

The mixture can be selectively applied only to the position where the semiconductor light emitting device is disposed. The mixture can be applied to cover a plurality of adjacent semiconductor light emitting devices, or can be applied to cover only one semiconductor light emitting device. Accordingly, a plurality of anisotropic conductive layers can be formed, and the plurality of anisotropic conductive layers can be spaced apart from each other.

Then, the step of curing the mixture proceeds. The mixture can be cured through photo-curing or thermal curing. However, the curing method of the mixture is not limited thereto.

As described above, the anisotropic conductive layer can be formed by coating a light-transmitting resin and conductive particles in a mixed state.

In another embodiment, referring to FIG. 13, the forming of the anisotropic conductive layer can include a step of coating a resin 330 on at least some of the plurality of semiconductor light emitting devices 350 disposed on the transfer substrate W and a step of coating 331 conductive particles on the semiconductor light emitting device to which the resin 330 is applied.

The resin 330 can be selectively applied only to the region where the semiconductor light emitting device 350 is formed. To this end, the step of applying the resin 330 can be performed through screen printing.

The resin 330 can be coated to cover a plurality of adjacent semiconductor light emitting devices, or can be coated to cover only one semiconductor light emitting device. Accordingly, a plurality of anisotropic conductive layers can be formed, and the plurality of anisotropic conductive layers can be spaced apart from each other.

The resin 330 can be coated to cover a plurality of adjacent semiconductor light emitting devices, or can be coated to cover only one semiconductor light emitting device. Accordingly, a plurality of anisotropic conductive layers can be formed, and the plurality of anisotropic conductive layers can be spaced apart from each other.

Thereafter, when the conductive particles 331 are applied, the conductive particles 331 are selectively fixed only to the positions where the resin 330 is formed.

Thereafter, the step of curing the resin 330 proceeds. The resin 330 can be cured through photo curing or thermal curing. However, the curing method of the resin 330 is not limited thereto.

As described above, when the method of applying the conductive particles 331 after coating the resin 330 is used, the conductive particles can be concentrated on the surface of the resin 330. Through this, the present invention minimizes the deviation of the conductive particles from the designated positions when the wiring substrate and the transfer substrate are compressed.

Referring back to FIGS. 12 and 13, after the anisotropic conductive layer is formed, the steps of aligning the substrate 310 on which the wiring electrode 320 is formed with the transfer substrate W and pressing the substrate 310 on the transfer substrate W are performed.

Since the anisotropic conductive layer 330 according to the present invention is formed to a very thin thickness, the anisotropic conductive layer 330 does not flow significantly during the compression process. In the compression step, a part of the anisotropic conductive layer 330 can flow, but since most of space between the semiconductor light emitting devices 350 and the wiring electrode 320 is an empty space 360, the anisotropic conductive layer 330 flows into the empty space. Through this, the present invention allows the pressure to be uniformly applied to the entire area of the substrate 310 during the compression process.

In the compression step, the conductive particles 331 are compressed to electrically connect the semiconductor light emitting device 350 and the wiring electrode 320. According to the present invention, since the flow of the anisotropic conductive layer 330 is minimized, the possibility that the conductive particles 331 deviate from a position between the semiconductor light emitting device 350 and the wiring electrode 320 in the pressing step is very low.

On the other hand, the anisotropic conductive layer is not formed on a portion of the semiconductor light emitting device 350 disposed on the transfer substrate W. The semiconductor light emitting device on which the anisotropic conductive layer is not formed is not transferred to the substrate 310. As described above, according to the present invention, by selectively forming an anisotropic conductive layer on only some of the plurality of semiconductor light emitting devices, some of the semiconductor light emitting devices disposed on the transfer substrate W can be selectively transferred.

Meanwhile, the present invention can provide a method for providing a planarization layer while strongly fixing a semiconductor light emitting device on a wiring substrate after pressing the semiconductor light emitting device on a wiring electrode.

FIGS. 14 to 16 are conceptual views illustrating a method of transferring a semiconductor light emitting device after forming an anisotropic conductive layer.

Referring to the drawings, a step of curing after injecting a light-transmitting resin into the empty space 360 formed between the transfer substrate W and the substrate 310 is performed.

As a result of the compression step, an empty space 360 is formed between the transfer substrate W and the substrate 310. For planarization, a light-transmitting resin is injected into the empty space 360. The light-transmitting resin 370 supplements the fixing ability of the anisotropic conductive layer 330, which is reduced by decreasing the thickness of the anisotropic conductive layer 330. Specifically, the anisotropic conductive layer 330 having a reduced thickness cannot sufficiently fix the semiconductor light emitting device 350 pressed to the wiring electrode. The light-transmitting resin 370 serves to strongly fix the semiconductor light emitting device 350 to the substrate 310 from the side of the semiconductor light emitting device 350. Through this, the present invention can prevent the semiconductor light emitting device from being separated from the substrate 310 even when the thickness of the anisotropic conductive layer 330 is reduced.

Meanwhile, in order to prevent the resin from leaking out in the step of hardening after injecting the light-transmitting resin 370 into the empty space 360, a sealing layer 390 can be formed on the edge of the substrate.

The sealing layer 390 is disposed between the substrate 310 and the transfer substrate W, and prevents the resin from leaking out from the edge of the substrate 310. In the step of injecting and curing the light-transmitting resin into the empty space 360, the transfer substrate W limits the height of the light-transmitting resin layer 370 to only a certain level. Accordingly, the height of the semiconductor light emitting device 350 becomes equal to the height of the light-transmitting resin layer 370. For this reason, the present invention does not require a separate planarization process after transferring the semiconductor light emitting device.

Finally, a step of removing the transfer substrate W proceeds. The transfer substrate can be removed by laser lift-off (LLO), but is not limited thereto.

Hereinafter, a display device manufactured by the method described above with reference to FIG. 17 will be described.

FIG. 17 is a cross-sectional view showing a cross-section of a display device according to the present invention.

Referring to FIG. 17, the conductive particles 331 positioned between the semiconductor light emitting device 350 and the wiring electrode 320 electrically connect the semiconductor light emitting device 350 and the wiring electrode 320 in a compressed state.

The light-transmitting layer 370 is formed between the wiring electrodes 320 and between the semiconductor light emitting devices 350. In addition, the light transmitting layer 370 is formed up to the height of the semiconductor light emitting device 350, and planarizes the substrate 310 to which the semiconductor light emitting device 350 is transferred.

The anisotropic conductive layer can be made of a plurality, and any one of the plurality of anisotropic conductive layers spaced apart from each other is formed to surround one semiconductor light emitting device 350 or is formed to surround the plurality of semiconductor light emitting devices 350 adjacent to each other.

On the other hand, the anisotropic conductive layer is formed to surround each side of the semiconductor light emitting device (350). Light emitted from the semiconductor light emitting device 350 passes through the anisotropic conductive layer and is emitted to the outside.

Meanwhile, since the semiconductor light emitting device is transferred while the anisotropic conductive layer is formed on the transfer substrate W, the anisotropic conductive layer does not contact the substrate 310 on which the wiring electrode 320 is formed.

Meanwhile, the wiring electrode 320 includes a first region overlapping the anisotropic conductive layer and a second region not overlapping the anisotropic conductive layer. The semiconductor light emitting devices 350 are electrically connected to the wiring electrodes 320 formed in a line shape at regular intervals. Since the anisotropic conductive layer is formed only at the position where the semiconductor light emitting device 350 is disposed, the remaining regions of the wiring electrode 320 except for the region connected to the semiconductor light emitting device 350 do not overlap the anisotropic conductive layer.

The second region that does not overlap the anisotropic conductive layer among the entire region of the wiring electrode 320 overlaps the light transmitting layer 370.

The display device using the semiconductor light emitting device described above is not limited to the configuration and method of the embodiments described above, the above embodiments can be configured by selectively combining all or part of each of the embodiments so that various modifications can be made.

The invention claimed is:

1. A method of manufacturing a display device by transferring a plurality of semiconductor light emitting devices to a substrate on which wiring electrodes are formed, the method comprising:

forming an anisotropic conductive layer on at least some of the plurality of semiconductor light emitting devices disposed on a transfer substrate;

aligning the substrate on which the wiring electrode is formed with the transfer substrate;

pressing the substrate onto the transfer substrate;

injecting and curing a light-transmitting resin into an empty space formed between the transfer substrate and the substrate; and removing the transfer substrate from the substrate.

2. The method according to claim 1, wherein the forming of the anisotropic conductive layer on at least some of the plurality of semiconductor light emitting devices disposed on the transfer substrate comprises:

applying a resin to the at least some of the plurality of semiconductor light emitting devices disposed on the transfer substrate;

applying conductive particles on the at least some of the plurality of semiconductor light emitting devices coated with the resin; and curing the applied resin.

3. The method according to claim 2, wherein the curing of the applied resin after the injecting of the light-transmitting resin into the empty space formed between the transfer substrate and the substrate is carried out after forming a sealing layer on an edge of the substrate.

4. The method according to claim 1, wherein the anisotropic conductive layer is formed to surround each of the plurality of semiconductor light emitting devices, and wherein each of the wiring electrodes comprises a first region overlapping the anisotropic conductive layer, and a second region not overlapping the anisotropic conductive layer.

5. The method according to claim 1, wherein the anisotropic conductive layer is formed to surround a side surface of each of the plurality of semiconductor light emitting devices.

* * * * *